(12) United States Patent
Hong et al.

(10) Patent No.: US 9,897,663 B2
(45) Date of Patent: Feb. 20, 2018

(54) INTEGRATED DC/DC CONVERTER, ELECTROCHEMICAL ENERGY STORAGE SYSTEM, AND METHODS FOR ANALYZING ELECTROCHEMICAL IMPEDANCE SPECTROSCOPY AND WORKING STATE OF ELECTROCHEMICAL ENERGY STORAGE APPARATUS

(71) Applicant: Tsinghua University, Beijing (CN)

(72) Inventors: Po Hong, Beijing (CN); Jian-Qiu Li, Beijing (CN); Liang-Fei Xu, Beijing (CN); Ming-Gao Ouyang, Beijing (CN)

(73) Assignee: Tsinghua University, Beijing (CN)

( * ) Notice: Subject to any disclaimer, the term of this patent is extended or adjusted under 35 U.S.C. 154(b) by 202 days.

(21) Appl. No.: 14/973,905

(22) Filed: Dec. 18, 2015

(65) Prior Publication Data
US 2016/0103186 A1    Apr. 14, 2016

Related U.S. Application Data

(63) Continuation-in-part of application No. PCT/CN2015/078178, filed on May 14, 2015.

(30) Foreign Application Priority Data

Aug. 8, 2014    (CN) .......................... 2014 1 0387807
Aug. 8, 2014    (CN) .......................... 2014 1 0389361

(51) Int. Cl.
*G01N 27/416*    (2006.01)
*G01R 31/36*    (2006.01)
(Continued)

(52) U.S. Cl.
CPC ......... *G01R 31/3662* (2013.01); *G01R 31/00* (2013.01); *G01R 31/36* (2013.01);
(Continued)

(58) Field of Classification Search
USPC .......................................... 324/430
See application file for complete search history.

(56) References Cited

U.S. PATENT DOCUMENTS

2007/0172708 A1* 7/2007 Takebe ............... G01R 31/3679
                                                      429/431
2007/0259256 A1* 11/2007 Le Canut .......... H01M 8/04089
                                                       429/90
(Continued)

FOREIGN PATENT DOCUMENTS

CN        1930718 A        3/2007
CN        101107538        1/2008
(Continued)

*Primary Examiner* — Samuel Berhanu

(57) ABSTRACT

An integrated DC/DC converter includes a first DC/DC converter, a second DC/DC converter, a first voltage sensor, a second voltage sensor, a first current sensor, a second current sensor, a third current sensor, and a controller. The first DC/DC converter has an input end and an output end. The input end of the first DC/DC converter is to be electrically connected to an output end of an electrochemical energy storage apparatus. The output end of the first DC/DC converter is to be electrically connected to an input end of an electrical load. The second DC/DC converter connects the first DC/DC converter in parallel.

19 Claims, 19 Drawing Sheets

(51) Int. Cl.
- *G01R 31/00* (2006.01)
- *H01M 10/42* (2006.01)
- *H01M 10/48* (2006.01)
- *H01M 8/04537* (2016.01)
- *H02M 3/00* (2006.01)

(52) U.S. Cl.
CPC .... *G01R 31/3648* (2013.01); *H01M 8/04544* (2013.01); *H01M 8/04574* (2013.01); *H01M 8/04634* (2013.01); *H01M 10/425* (2013.01); *H01M 10/48* (2013.01); *H02M 3/00* (2013.01)

(56) References Cited

U.S. PATENT DOCUMENTS

| | | | | |
|---|---|---|---|---|
| 2007/0275276 | A1* | 11/2007 | Saeki | B60L 11/1887 |
| | | | | 429/431 |
| 2008/0036432 | A1* | 2/2008 | Takada | H01M 8/04559 |
| | | | | 323/234 |
| 2008/0136260 | A1* | 6/2008 | Watanabe | H02M 3/158 |
| | | | | 307/18 |
| 2010/0167149 | A1* | 7/2010 | Ishikawa | H01M 8/04029 |
| | | | | 429/434 |
| 2010/0286939 | A1 | 11/2010 | Oh et al. | |
| 2013/0057292 | A1* | 3/2013 | Hasegawa | H01M 8/04559 |
| | | | | 324/430 |
| 2014/0152089 | A1* | 6/2014 | Manabe | H02M 3/1584 |
| | | | | 307/9.1 |

FOREIGN PATENT DOCUMENTS

| | | |
|---|---|---|
| CN | 103098278 | 5/2013 |
| CN | 104155611 A | 11/2014 |
| CN | 104158397 A | 11/2014 |

\* cited by examiner

INTEGRATED DC/DC CONVERTER, ELECTROCHEMICAL ENERGY STORAGE SYSTEM, AND METHODS FOR ANALYZING ELECTROCHEMICAL IMPEDANCE SPECTROSCOPY AND WORKING STATE OF ELECTROCHEMICAL ENERGY STORAGE APPARATUS

CROSS-REFERENCE TO RELATED APPLICATIONS

This application claims all benefits accruing under 35 U.S.C. § 119 from China Patent Applications No. 201410387807.5, filed on Aug. 8, 2014 and No. 201410389361.X, filed on Aug. 8, 2014 in the China Intellectual Property Office, the content of which is hereby incorporated by reference. This application is a continuation in part under 35 U.S.C. § 120 of international patent application PCT/CN2015/078178 filed May 4, 2015.

FIELD

The present disclosure relates to DC/DC converters and electrochemical energy storage systems, and particularly relates to an integrated DC/DC converter that is capable of monitoring working state of battery, and an electrochemical energy storage system including the integrated DC/DC converter. The present disclosure also relates to a method for analyzing electrochemical impedance spectroscopy of an electrochemical energy storage apparatus, and a method for monitoring working state of the electrochemical energy storage apparatus.

BACKGROUND

A hydrogen and oxygen proton exchange membrane fuel cell (PEMFC) is an electrochemical apparatus which directly transforms chemical energy to electrical energy. Unlike a conventional internal combustion engine, the energy conversion of the PEMFC is not confined by Carnot cycle, and has a higher theoretical energy conversion efficiency. The PEMFC produces water and no harmful emissions by using hydrogen and oxygen gases as reactants, which makes it attractive and popular in electric stations, vehicles, and mobile power sources.

The PEMFC produces a direct current with an output voltage smaller than 1 V (typically 0.7 V) per cell. A series connection of multiple PEMFC cells, which forms a PEMFC stack, achieves a higher voltage. One single PEMFC cell includes components such as gas diffusion layer (GDL) for anode, membrane electrode assemblies (MEA), and GDL for cathode.

The fuel cell power generation system comprises the PEMFC stack which is an essential member, and multiple auxiliary systems, such as air and hydrogen supplying systems, cooling system, power adjusting system, moisture adjusting system, and control system, to assist operation of the stack. The air supplying system inputs a suitable amount of oxidants, such as air, and controls the temperature, pressure, and flow rate of the air supplied. The hydrogen supplying system inputs hydrogen, and controls the pressure and flow rate of the hydrogen gas supplied. The cooling system maintains the temperature of the stack to a suitable level. The power adjusting system controls the output voltage and current of the stack to meet the needs of an electrical load. The moisture adjusting system adjusts the wetness of the air that is supplied to the stack, to be within an optimal range, neither too dry nor too wet. The control system controls each auxiliary system to achieve a best working state of the stack.

The water produced by the PEMFC as gas or liquid is expelled from cathode by an air flow. A high flow rate of the air supplied to the stack can efficiently expel water. However, when the stack has a low load, only a small amount of water is produced. A high flow rate of air may dry the proton exchange membrane, which causes degeneration in the performance of the proton exchange membrane. Yet, a relatively low flow rate of air may expel water inefficiently and cause the fuel cell to flood. Precise control of the flow rate and moisture of the air is difficult to achieve, especially for a stack which has a large amount of non-identical cells.

The working state, such as the moistness of the proton exchange membrane and the flooded or partly flooded state of the fuel cell has a relationship with equivalent circuit impedance of the fuel cell. By obtaining a measure of the equivalent circuit impedance in real time, the working state of the fuel cell can be precisely analyzed and adjusted.

BRIEF DESCRIPTION OF THE DRAWINGS

Implementations are described by way of example only with reference to the attached figures.

DETAILED DESCRIPTION

Figure 1:
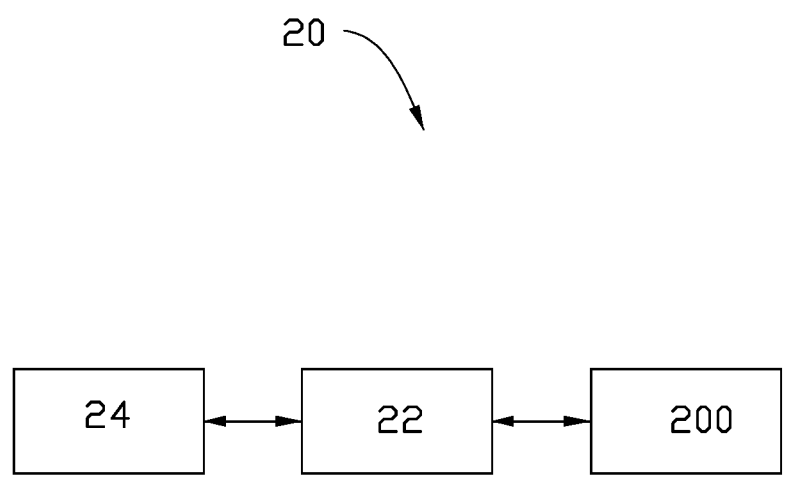
FIG. 1 is a block diagram of an embodiment of an electrochemical energy storage system.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "comprise" or "comprising" when utilized, means "include or including, but not necessarily limited to"; it specifically indicates open-ended inclusion or membership in the so-described combination, group, series, and the like. The terms "comprise", "comprising", "include", and "including" do not suggest that another undisclosed feature, element, component, or step must be required. Therefore, when using the term "comprise", "comprising", "include", or "including", the term "consist of" or "consisting of" can also be applied. The term "connect" or "connected" can mean both "directly connect" or "directly connected" and "indirectly connect" or "indirectly connected."

Referring to FIG. 1, one embodiment of an electrochemical energy storage system 20 comprises an electrochemical energy storage apparatus 22, a control system 24, and an integrated DC/DC converter 200. The control system 24 is capable of maintaining a stable electric energy output of the electrochemical energy storage apparatus 22. The integrated DC/DC converter 200 is electrically connected to the electrochemical energy storage apparatus 22, and is capable of regulating the electric energy output from the electrochemical energy storage apparatus 22 to satisfy an electrical load.

Figure 2:
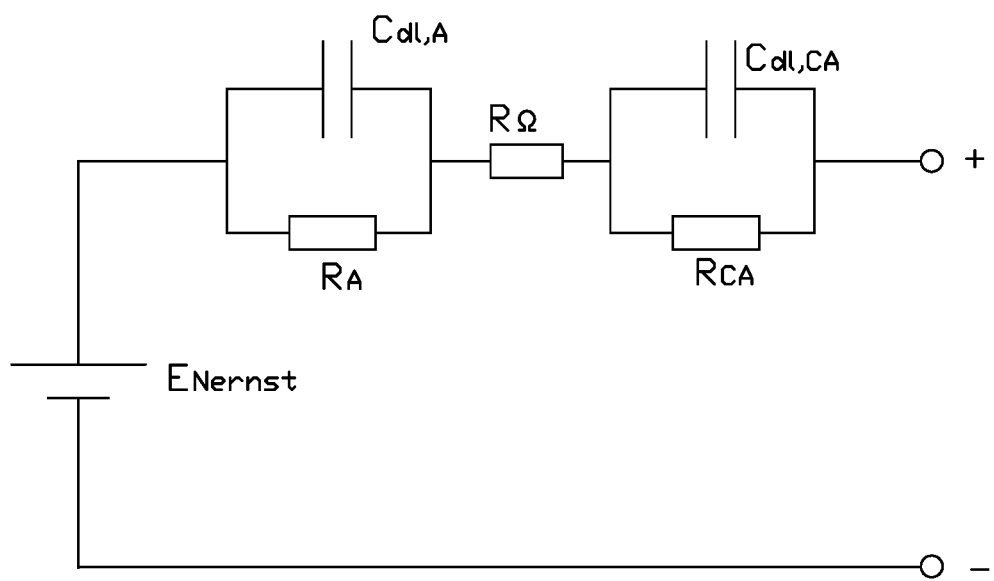
FIG. 2 is an embodiment of an equivalent circuit diagram of an electrochemical energy storage cell.
Figure 3:
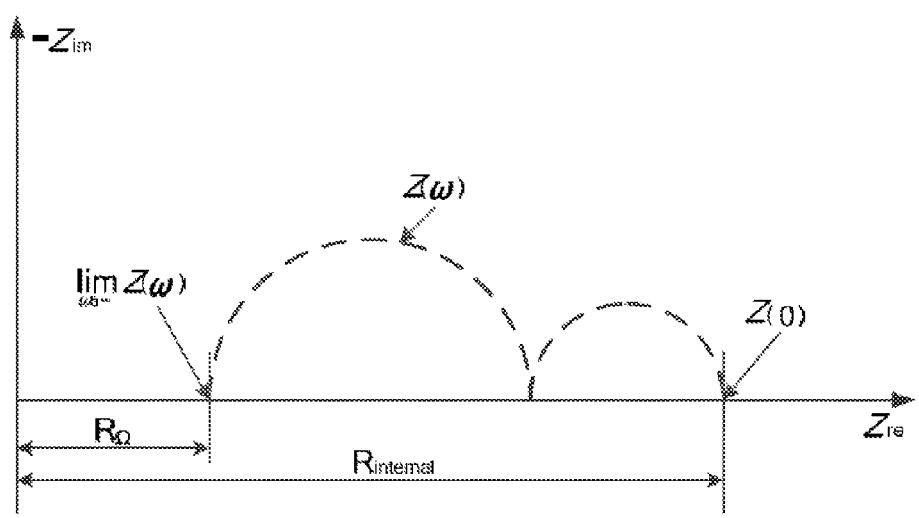
FIG. 3 is a diagram showing electrochemical impedance spectroscopy of the equivalent circuit diagram shown in FIG. 2.

The electrochemical energy storage apparatus 22 can comprise one or a plurality of electrochemical energy storage cells. The electrochemical energy storage cell generates electric energy from a chemical reaction. The electrochemical energy storage cell comprises a cathode, an anode, and an electrolyte separator located between the cathode and the anode. Referring to FIG. 2, the electrochemical energy storage cell can be represented by a circuit ("equivalent circuit") consisting of a Nernst voltage ($E_{Nernst}$), an anodic double layer capacitor ($C_{dl,A}$), an anode resistor ($R_A$), a cathodic double layer capacitor ($C_{dl,CA}$), a cathodic resistor ($R_{CA}$), and proton exchange membrane as a resistor ($R_\Omega$). A parallel connection is made between the $C_{dl,A}$ and $R_A$ to form an anodic RC circuit. Another parallel connection is also made between the $C_{dl,CA}$ and $R_{CA}$ to form a cathodic RC circuit. The $E_{Nernst}$, cathodic RC circuit, $R_\Omega$, and anodic RC circuit are connected in series. Referring to FIG. 3, an electrochemical impedance of the equivalent circuit shown in FIG. 2 satisfies equations (1) and (2):

$$Z(\omega) = R_\Omega + \frac{R_A}{1 + jwR_A C_{dl,A}} + \frac{R_{CA}}{1 + jwR_{CA} C_{dl,CA}}; \quad (1)$$

$$Z(0) = R_\Omega + R_A + R_{CA} = R_{internal}, \quad (2)$$

wherein $Z(\omega)$ is the electrochemical impedance of the equivalent circuit, which varies depending on angular frequency $\omega$. When the electrochemical energy storage cell outputs a direct current (i.e., $\omega=0$) satisfying the equation (2), the electrochemical impedance of the equivalent circuit is equal to a total internal resistance $R_{internal}$ of the electrochemical energy storage cell.

By detecting the impedances of the equivalent circuit during working of the electrochemical energy storage apparatus 22, working conditions (such as temperature and moisture) of each component in the electrochemical energy storage apparatus 22 can be analyzed, and the working conditions can be dynamically adjusted to effectively improve the performance of the electrochemical energy storage apparatus 22. The electrochemical energy storage cell can be at least one of a fuel cell, a lithium battery, and a supercapacitor. In one embodiment, the electrochemical energy storage cell is a fuel cell, and the electrochemical energy storage apparatus 22 is a fuel cell stack formed by connecting a plurality of fuel cells in series.

Figure 4:
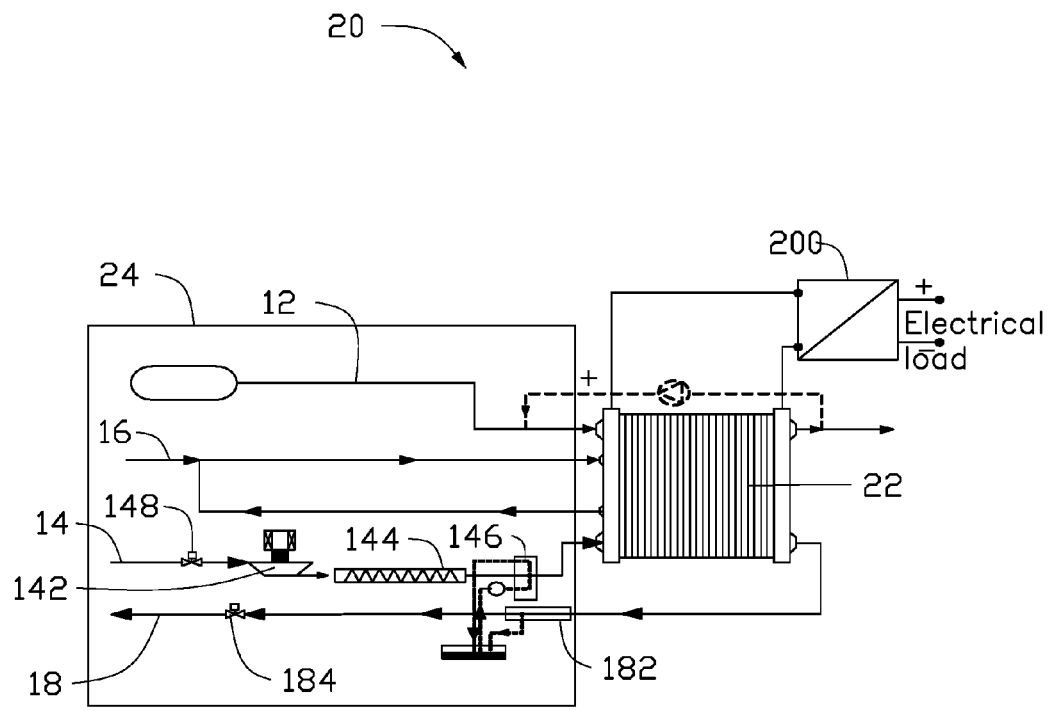
FIG. 4 is a schematic view of an embodiment of an electrochemical energy storage system.

The control system 24 is selected to suit the type of the electrochemical energy storage apparatus 22. For example, when the electrochemical energy storage apparatus 22 is a lithium ion battery pack, the control system 24 can be a lithium ion battery management unit to detect temperatures and electrical readings, such as voltages and currents, of lithium ion battery pack or cells, and to unify the lithium ion battery cells. Referring to FIG. 4, in one embodiment of the electrochemical energy storage system 20, the electrochemical energy storage apparatus 22 is a fuel cell stack. The control system 24 is designed for the fuel cell stack, and comprises a hydrogen supplying system 12, an air supplying system 14, a cooling system 16, a recycling system 18, a temperature and moisture detecting system, and a working condition adjusting system. The working condition adjusting system adjusts the working conditions of the fuel cell stack according to readings taken by the other systems. The air supplying system 14 comprises an air compressor 142, a heat radiator 144, a humidifier 146, and a first flowing control member 148. The recycling system 18 comprises a condenser 182 and a second flowing control member 184. Air is compressed by the air compressor 142, cooled by the heat radiator 144, moistened by the humidifier 146, and then introduced to the fuel cell stack, which is the electrochemical energy storage apparatus 22. The oxygen gas from the cathode of the fuel cell stack chemically reacts with the hydrogen ions from the anode to produce electric energy and water. Due to the chemical reaction, the oxygen amount decreases and the water amount increases in the air at the cathode. The air expelled from the fuel cell stack is dried by the condenser 182 to recycle the water. The flow rate and pressure of the air can be controlled by the air compressor 142, the first flowing control member 148, and the second flowing control member 184. The temperature and moisture in the air can be detected by the temperature and moisture detecting system which delivers data of readings to the working condition adjusting system. The working condition adjusting system controls the temperature of the air through the heat radiator 144, and the moisture of the air through the humidifier 146.

Figure 5:
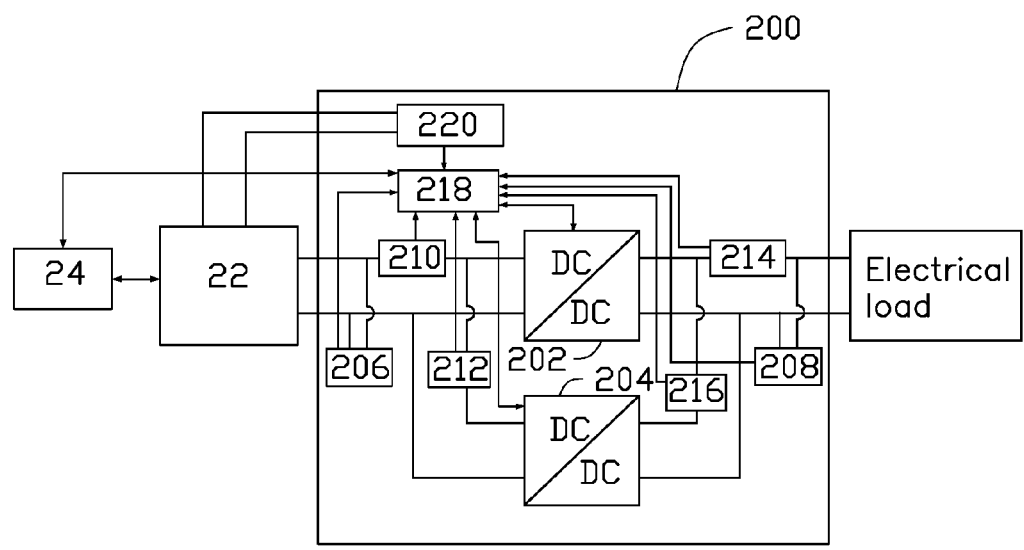
FIG. 5 is a schematic view of an embodiment of an integrated DC/DC converter.

Referring to FIG. 5, the integrated DC/DC converter 200 comprises a first DC/DC converter 202, a second DC/DC converter 204, a first voltage sensor 206, a second voltage sensor 208, a first current sensor 210, a second current sensor 212, a third current sensor 214, a fourth current sensor 216, and a controller 218. The first and second DC/DC converters 202, 204 are connected in parallel. Each of the first and second DC/DC converters 202, 204 has an input end and an output end. The electrochemical energy storage apparatus 22 has an output end to output electric energy. The electrical load has an input end to receive the electric energy output from the electrochemical energy storage apparatus 22, and the integrated DC/DC converter 200 performs adjustment and control. The input end of the first DC/DC converter 202 is electrically connected to the output end of the electrochemical energy storage apparatus 22. The output end of the first DC/DC converter 202 is electrically connected to the input end of the electrical load. The first voltage sensor 206 is electrically connected in parallel with the input end of the first DC/DC converter 202 to detect an output voltage of the electrochemical energy storage apparatus 22. The second voltage sensor 208 is electrically connected in parallel to the output end of the first DC/DC converter 202 to detect an output voltage of the first DC/DC converter 202. The first current sensor 210 and the output end of the electrochemical energy storage apparatus 22 are connected in series. The first current sensor 210 is capable of detecting an output current of the electrochemical energy storage apparatus 22. The second current sensor 212 and the input end of the second DC/DC converter 204 are connected in series. The second current sensor 212 is capable of detecting an input current of the second DC/DC converter 204. The third current sensor 214 and the output end of the first DC/DC converter 202 are connected in series. The third current sensor 214 is capable of detecting the output current of the first DC/DC converter 202. The fourth current sensor 216 and the output end of the second DC/DC converter 204 are connected in series. The fourth current sensor 216 is capable of detecting the output current of the second DC/DC converter 204. The controller 218 receives signals from the first voltage sensor 206, the second voltage sensor 208, the first current sensor 210, and the third current sensor 214, and is capable of controlling the electric energy output from the electrochemical energy storage apparatus 22 through the first DC/DC converter 202 to the electrical load. The controller 218 also controls the second DC/DC converter 204 to be on or off. The controller 218 can also receive signals from the second current sensor 212 and the fourth current sensor 216. When the second DC/DC converter 204 is on, the controller 218 controls the second DC/DC converter 204 to add an electrical disturbance to the output current of the electrochemical energy storage apparatus 22 to achieve an electrochemical impedance spectroscopy of the electrochemical energy storage apparatus 22.

The first and second DC/DC converters, 202 and 204, can be of any known type, such as at least one of a buck DC/DC converter, a boost DC/DC converter, and a buck-boost DC/DC converter. In one embodiment for use in a vehicle, the first DC/DC converter 202 can be a high power DC/DC converter that is capable of meeting a vehicle power requirement. In one embodiment, the high power of the first DC/DC converter 202 can be greater than or equal to 20 kW (e.g., 20 kW to 80 kW). The first DC/DC converter 202 is capable of adjusting the output current of the electrochemical energy storage apparatus 22 to meet and satisfy the electrical load.

The second DC/DC converter 204 is a signal disturbance source, adding a disturbance to the output current of the electrochemical energy storage apparatus 22 to detect the electrochemical impedance spectroscopy of the electrochemical energy storage apparatus 22. The second DC/DC converter 204 can be a high frequency DC/DC converter, which, while decreasing the influence on and disturbance to the electric energy output, detects the electrochemical impedance spectroscopy of the electrochemical energy storage apparatus 22. The frequency of the second DC/DC converter 204 can be in a range from about 0.1 Hz to about 1 kHz.

Figure 6:
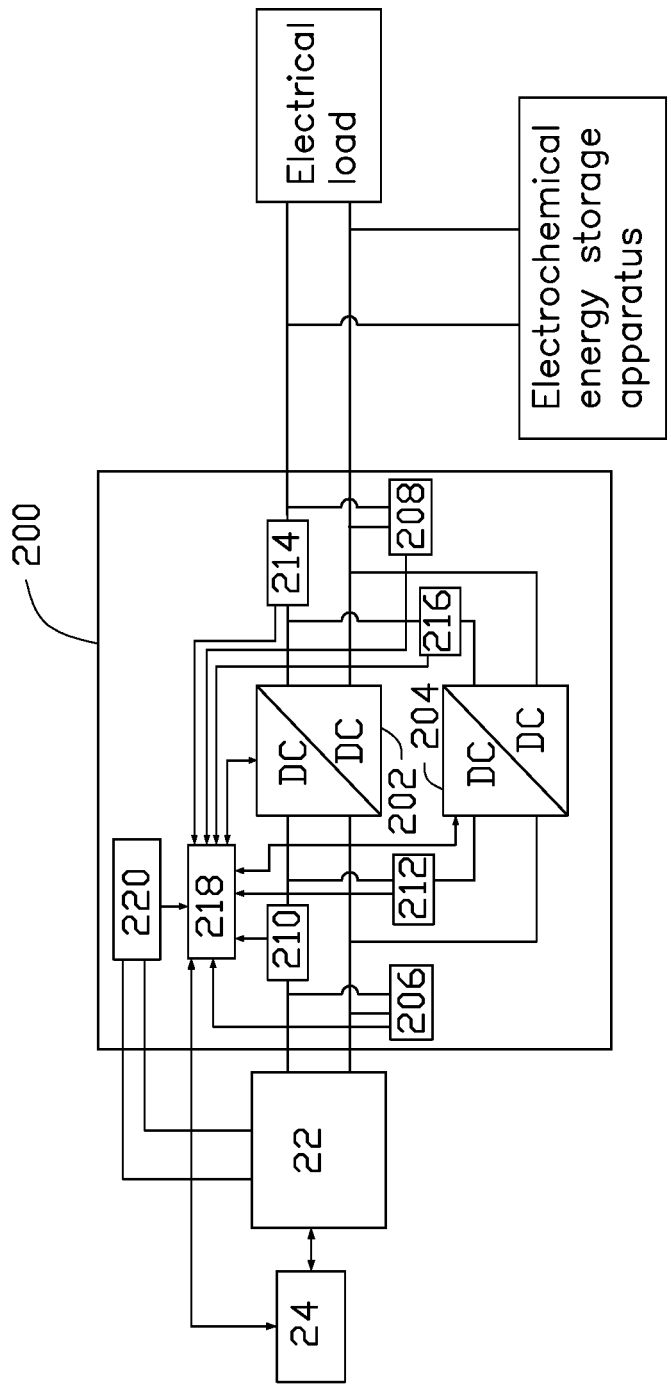
FIG. 6 is a schematic view of an embodiment of an application of the integrated DC/DC converter.

Referring to FIG. 6, in one application, the input end of the integrated DC/DC converter 200 can be electrically connected to the electrochemical energy storage apparatus 22, such as a PEMFC stack, a lithium ion battery pack, or a supercapacitor. The output end of the integrated DC/DC converter 200 can be electrically connected to the electrical load as shown in FIG. 5. In addition to the electrical load, another electrochemical energy storage apparatus, such as another lithium ion battery pack or supercapacitor, also can be electrically connected to the output end of the integrated DC/DC converter 200. The electrochemical energy storage apparatus 22 connected to the input end of the integrated DC/DC converter 200 is then a first electrochemical energy storage apparatus. The electrochemical energy storage apparatus connected to the output end of the integrated DC/DC converter 200 is then a second electrochemical energy storage apparatus. The second electrochemical energy storage apparatus and the electrical load can be connected in parallel. The second electrochemical energy storage apparatus can maintain the output voltage of the integrated DC/DC converter 200, and can be used in other applications, such as providing a transient high power output or restoring energy from the electrical load.

Figure 7:
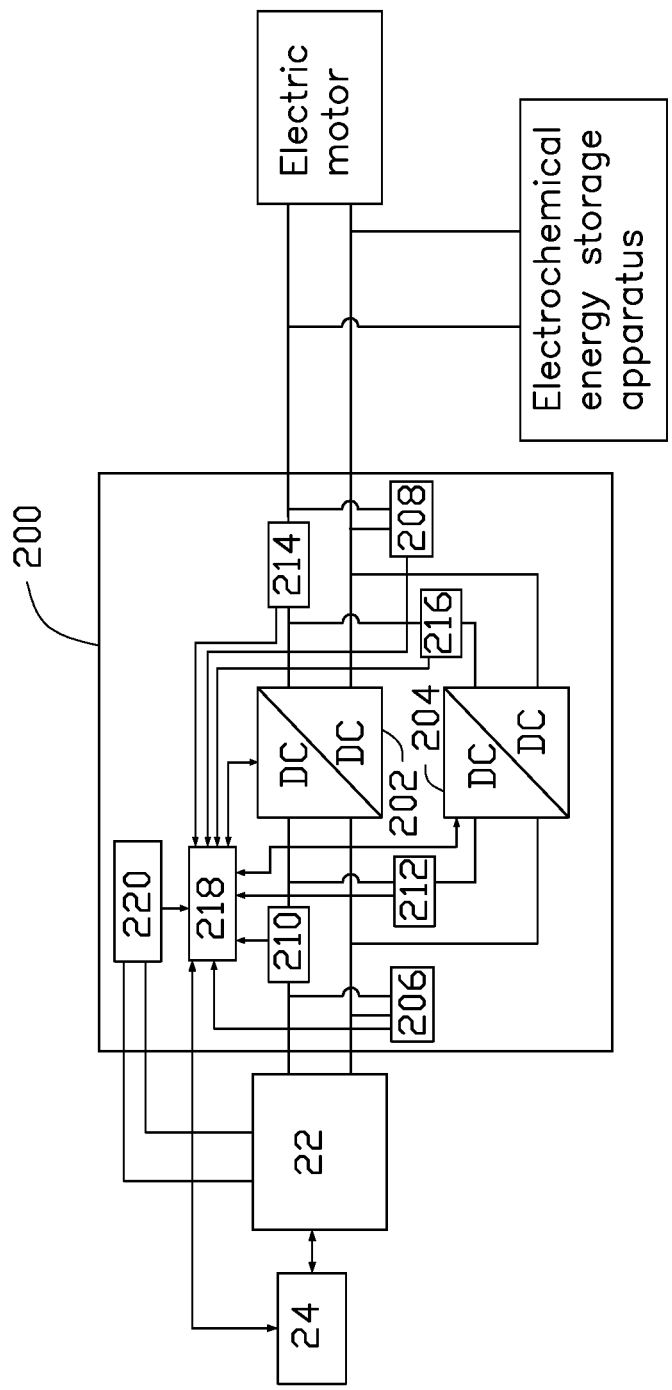
FIG. 7 is a schematic view of an embodiment of another application of the integrated DC/DC converter.

Referring to FIG. 7, in another application, the input end of the integrated DC/DC converter 200 can be electrically connected to the first electrochemical energy storage apparatus 22, the apparatus 22 being a PEMFC stack, a lithium ion battery pack, or a supercapacitor. The output end of the integrated DC/DC converter 200 can be electrically connected to an electric motor and to the second electrochemical energy storage apparatus. The electric motor can be an AC asynchronous motor, a permanent-magnet synchronous motor, or a DC motor. The electric motor and the second electrochemical energy storage apparatus are electrically connected in parallel. The second electrochemical energy storage apparatus can maintain the output voltage of the integrated DC/DC converter 200, and can be used in other applications, such as providing transient high power output or restoring energy from the motor. The motor can have many applications, such as motive power source or a braking energy recovery device of a vehicle.

Figure 8:
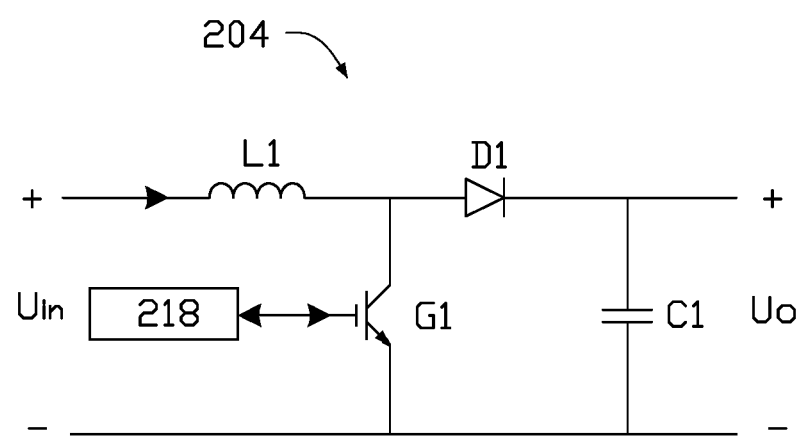
FIG. 8 is a circuit diagram of an embodiment of a second DC/DC converter.

Referring to FIG. 8, in one embodiment, the second DC/DC converter 204 is a boost DC/DC converter, comprising an inductor L1, a diode D1, a switch G1, and a capacitor C1. One end of the inductor L1 is an input terminal such as a positive input terminal of the second DC/DC converter 204. The other end of the inductor L1 is electrically connected to the anode of the diode D1. The cathode of the diode D1 is an output terminal such as a positive output terminal of the second DC/DC converter 204. Switches in the second DC/DC converter 204 can each be a transistor with base, collector, and emitter terminals. The switch G1 has the base electrically connecting to the controller 218, the collector electrically connecting to the anode of the diode D1, and the emitter being both the other input terminal such as a negative input terminal and the other output terminal such as a negative output terminal of the second DC/DC converter 204. The capacitor C1 has one end electrically connected to the cathode of the diode D1, and the opposite end electrically connected to the emitter of the switch G1. The switch G1 can be an insulated gate bipolar transistor (IGBT).

The working process of the second DC/DC converter 204 is as follows:

(1) when the switch G1 is on, the current having the input voltage $U_{in}$ goes through the inductor L1 and is linearly increased by the inductor L1 depending on the characteristics of the inductor. The electric energy is stored in the inductor L1. The inductor L1 and the switch G1 form a conducting loop. The anode of the diode D1 electrically connects to the negative input end of the second DC/DC converter 204. The cathode of the diode D1 electrically connects to the positive output end of the second DC/DC converter 204. The diode D1 blocks current in the reverse direction and the capacitor C1 discharges electric energy to the electrical load.

(2) When the switch G1 is off, the inductor L1 does not immediately drop the current at the moment the switch G1 switches off, but forms an electric potential having a direction the same as the input voltage $U_{in}$. The electric energy stored in the inductor L1 gradually releases, charges the capacitor C1, and provides energy to the electric load through the diode D1. The inductor L1, diode D1, capacitor C1, and electrical load form a conducting loop.

(3) When the switch G1 periodically switches between on and off, the on and off switching of the switch G1 at different moments is controlled by the controller 218. Electric energy is delivered from the input end $U_{in}$ to output end $U_o$ of the second DC/DC converter 204 to generate current disturbance signals.

The first voltage sensor 206 and the first current sensor 210 can detect an overall electrical view of the electrochemical energy storage apparatus 22 from the readings.

The fourth current sensor 216 can cooperate with the second current censor 212 to monitor an efficiency of the second DC/DC converter 204, and detect a current change of the output current of the second DC/DC converter 204. A detected current change of the output current of the second DC/DC converter 204 is conducted to the controller 218 and used to evaluate the influence on the electrical load, a great influence on the electrical load should be avoided.

The controller 218 receives the data from the above disclosed sensors and controls the first and second DC/DC converters 202, 204 based on the requirements from the electrical load and the analyzing of the electrochemical impedance spectroscopy.

When the integrated DC/DC converter 200 is in a normal working state without a need for analyzing the electrochemical impedance spectroscopy, an electric current is supplied to the first DC/DC converter 202 (i.e., at the "on" state), the second DC/DC converter 204 is cut off from the circuit of the integrated DC/DC converter 200 (i.e., at the "off" state), and the controller 218 controls the first DC/DC converter 202 to adjust the output of the electrochemical energy storage apparatus 22 according to the data from the first voltage sensor 206, the second voltage sensor 208, the first current sensor 210, and the third current sensor 214, to satisfy the need of the electrical load.

When there is a need to analyze the electrochemical impedance spectroscopy of the electrochemical energy storage apparatus 22, currents are supplied to both the first DC/DC converter 202 and the second DC/DC converter 204 in the circuit of the integrated DC/DC converter 200 (i.e., both are at the "on" state). While performing the same adjusting process to the output of the electrochemical energy storage apparatus 22 through the controlling of the first DC/DC converter 202 in a normal working state, the controller 218 also receives data from the second current sensor 212 and the third current sensor 214. In one embodiment data is also received from the fourth current sensor 216. Based on the received data, the controller 218 controls the second DC/DC converter 204 to adjust the output current of the electrochemical energy storage apparatus 22 by the current disturbance from the second DC/DC converter 204 thereby achieving an electrochemical impedance spectroscopy of the electrochemical energy storage apparatus 22.

In one embodiment, the electrochemical energy storage apparatus 22 comprises a plurality of electrochemical energy storage cells, and the integrated DC/DC converter 200 further comprises a voltage inspecting device 220. The voltage inspecting device 220 is capable of acquiring a voltage of each electrochemical energy storage cell, and sending all the voltage data to the controller 218. By using the voltage inspecting device 220, an electrochemical impedance spectroscopy of each electrochemical energy storage cell in the electrochemical energy storage apparatus 22 can be obtained.

The electrical disturbance source is not limited to the second DC/DC converter 204. Any circuit that is capable of generating a current disturbance signal at a required frequency can be used as the disturbance source. The disturbance source can be electrically connected to the first DC/DC converter 202 in parallel, controlled by a switch, and generate the current disturbance signal by switching on and off.

Figure 9:
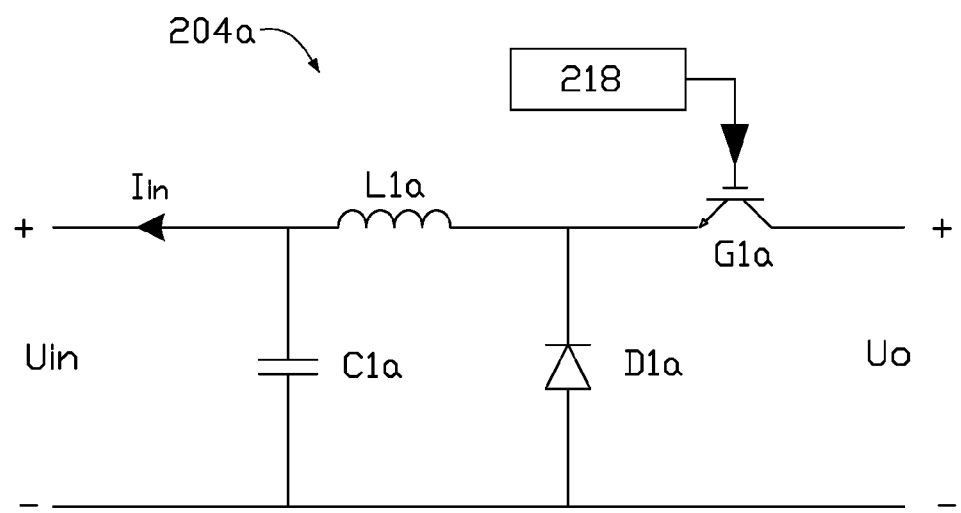
FIG. 9 is a circuit diagram of an embodiment of a disturbance source.

Referring to FIG. 9, in one embodiment, the disturbance source 204a comprises an inductor L1a, a capacitor C1a, a switch G1a, and a diode D1a. One end of the inductor L1a is electrically connected to the positive input terminal of the disturbance source 204a, and the other end of the inductor L1a is electrically connected to the emitter of the switch G1a. The capacitor C1a and the input end of the disturbance source 204a are electrically connected in parallel. The cathode of the diode D1a is electrically connected to the emitter of the switch G1a. The anode of the diode D1 is electrically connected to both a negative input terminal and a negative output terminal of the disturbance source 204a. The base of the switch G1a is electrically connected to the controller 218. The collector of the switch G1a is electrically connected to the positive output terminal of the disturbance source 204a. The switch G1a can be an IGBT.

Figure 10:
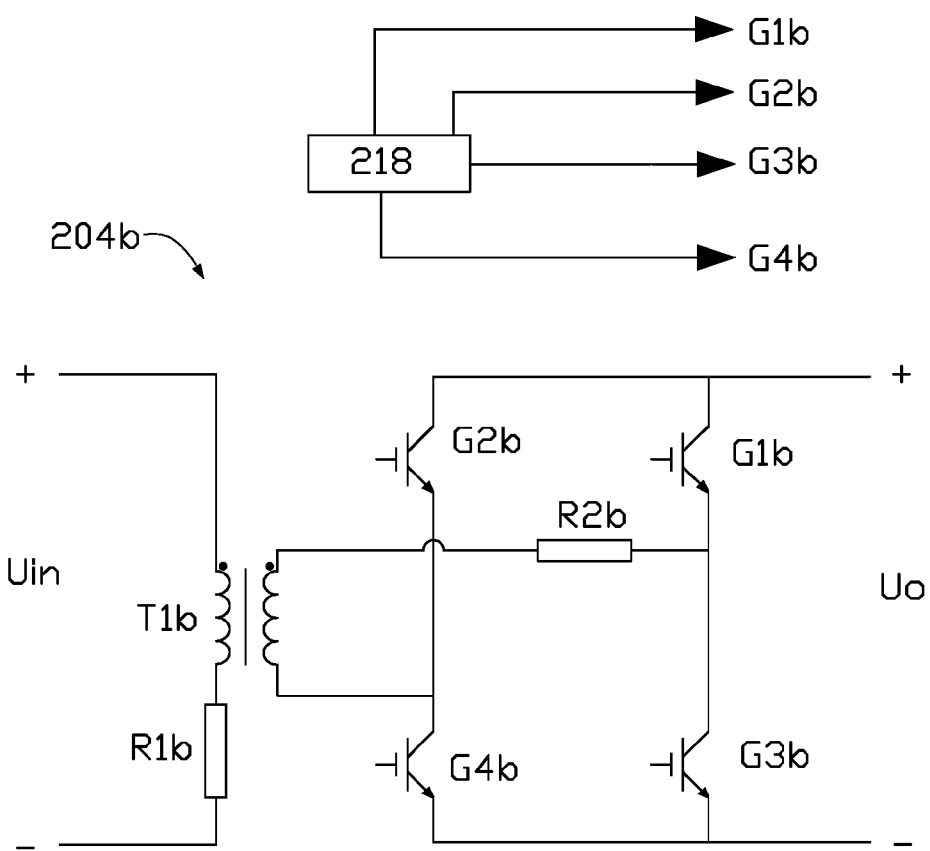
FIG. 10 is a circuit diagram of another embodiment of the disturbance source.

Referring to FIG. 10, in another embodiment, the disturbance source 204b comprises resistors R1b, R2b, a transformer T1b, and switches G1b, G2b, G3b, and G4b. The transformer T1b comprises primary and secondary windings. The primary winding has one end electrically connected to the positive input terminal of the disturbance source 204b and the other end electrically connected in series to the resistor R1b and the negative input terminal of the disturbance source 204b. The secondary winding has one end electrically connected in series to the resistor R2b and the emitter of the switch G1b and the other end electrically connected to the emitter of the switch G2b. The switches G1b, G2b, G3b and G4b form a bridge circuit. The bases of the switches G1b, G2b, G3b, and G4b are all electrically connected to the controller 218. The emitter of the switch G1b is electrically connected to the collector of the switch G3b. The collector of the switch G1b is electrically connected to the collector of the switch G2b, and is also electrically connected to the positive output terminal of the disturbance source 204b. The emitter of the switch G2b is electrically connected to the collector of the switch G4b. The emitter of the switch G3b is electrically connected to the emitter of the switch G4b, and is also electrically connected to the negative output terminal of the disturbance source 204b. The switches G1b, G2b, G3b, and G4b can be IGBTs.

The on and off switching of the switches G1, G1a, and G1b~G4b, controlled by the controller 218, allows the disturbance sources 204a, 204b, 204 to generate current disturbance signals having desired frequencies and amplitudes.

Figure 11:
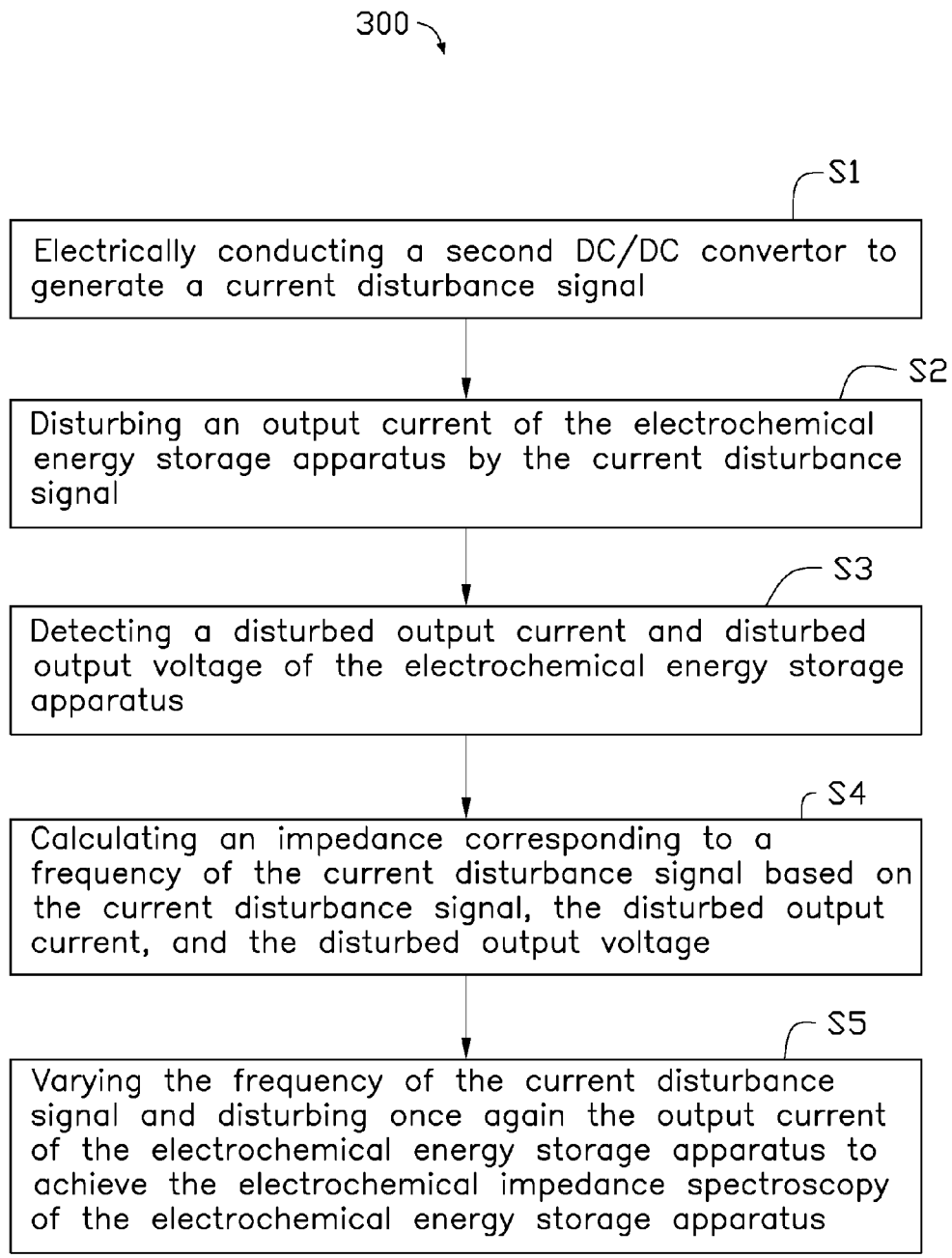
FIG. 11 is a flow chart of an embodiment of a method for analyzing electrochemical impedance spectroscopy of an electrochemical energy storage apparatus.

FIG. 11 presents a flowchart in accordance with an illustrated example embodiment. The embodiment of a method 300 for analyzing electrochemical impedance spectroscopy of an electrochemical energy storage apparatus 22 based on the integrated DC/DC converter 200 is provided by way of example, as there are a variety of ways to carry out the method 300. Each block shown in FIGS. 11 to 14 represents one or more processes, methods, or subroutines carried out in the exemplary method 300. Additionally, the illustrated order of blocks is by example only and the order of the blocks can be changed. The exemplary method 300 can begin at block S1. Depending on the embodiment, additional steps can be added, others removed, and the ordering of the steps can be changed.

At block S1, the second DC/DC converter 204 is electrically conducted, and meanwhile the controller 218 controls the second DC/DC converter 204 to generate a current disturbance signal. The current disturbance signal has a frequency.

At block S2, the current disturbance signal disturbs the output current of the electrochemical energy storage apparatus 22.

At block S3, the disturbed output current and disturbed output voltage of the electrochemical energy storage apparatus 22 are detected.

At block S4, an impedance corresponding to the frequency of the current disturbance signal is calculated based on the current disturbance signal, the disturbed output current, and the disturbed output voltage.

At block S5, the frequency of the current disturbance signal is varied. The output current of the electrochemical energy storage apparatus 22 is disturbed again by the varying frequency of the current disturbance signal thereby achieving an electrochemical impedance spectroscopy of the electrochemical energy storage apparatus 22.

Figure 12:
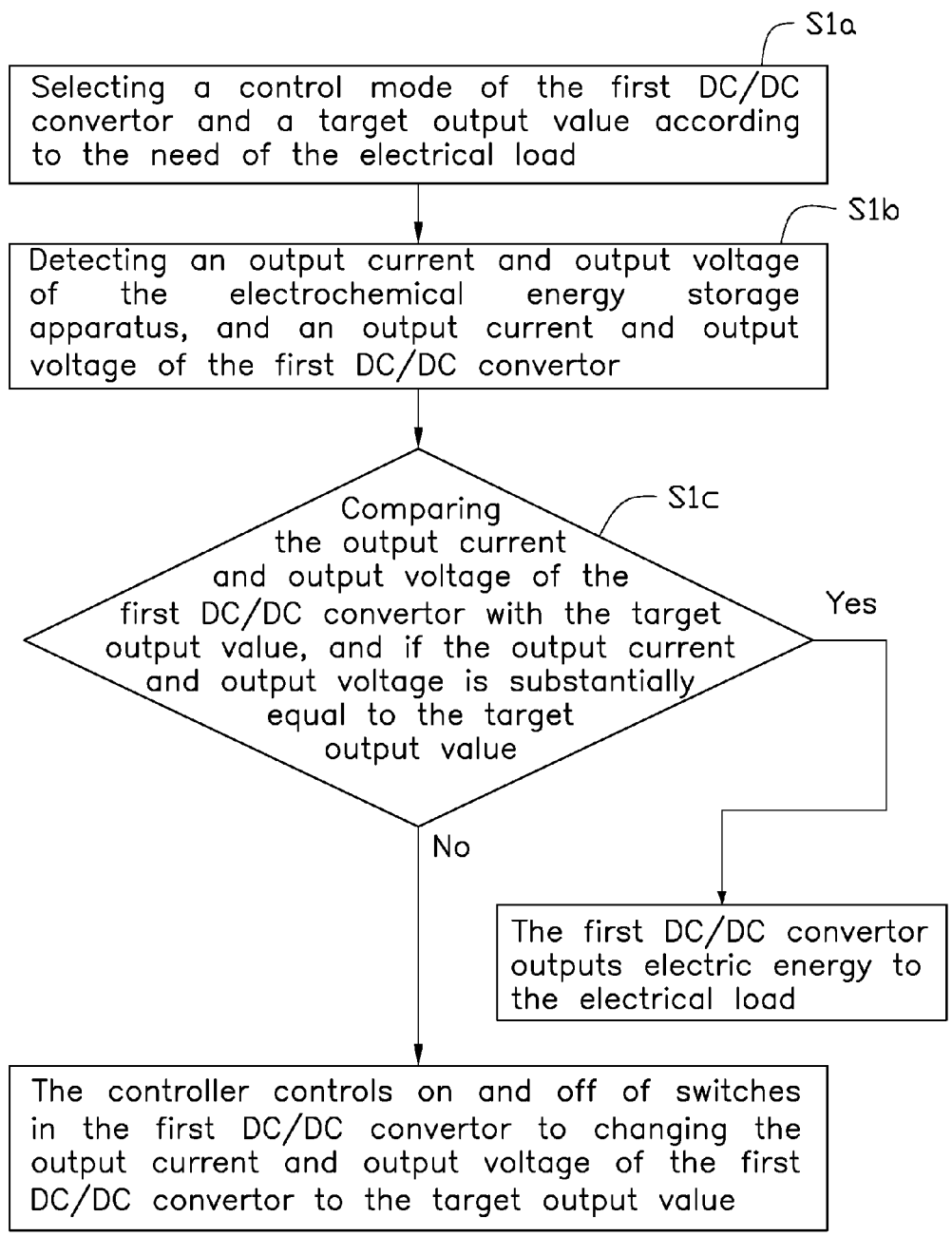
FIG. 12 is a flow chart of an embodiment of an operation of an embodiment of a first DC/DC converter.

Before and during the analyzing of the electrochemical impedance spectroscopy, the first DC/DC converter 202 works normally to output electric energy from the electrochemical energy storage apparatus 22 to the electrical load. Referring to FIG. 12, the working process of the first DC/DC converter 202 comprises steps shown in blocks S1a to S1c.

At block S1a, a control mode of the first DC/DC converter 202 and a target output value are selected according to the need of the electrical load.

At block S1b, the output current and output voltage of the electrochemical energy storage apparatus 22, and the output current and output voltage of the first DC/DC converter 202 are detected.

At block S1c, the output current and output voltage of the first DC/DC converter 202 detected in block S1b are compared with the target output values, wherein if the output current and output voltage are substantially equal to the target output values, then the first DC/DC converter 202 continues the same output of electric energy to the electrical load, and if the output current and output voltage are not substantially equal to the target output values, then the controller 218 controls switches in the first DC/DC converter 202 to increase the output current and output voltage of the first DC/DC converter 202 to the target output values. The output current and output voltage can be up to 5% larger or 5% smaller than the target output values.

At block S1a, the control mode, such as a current output or a voltage output, is selected according to the need of the electrical load. The output currents or output voltages of the electrochemical energy storage apparatus 22 and the first DC/DC converter 202 in the following steps are detected in the selected mode. The target output value is determined according to the need of the electrical load.

At block S1c, when the output current and output voltage are not substantially equal to the target output values, the time periods of on and off of the switches in the first DC/DC converter 202 can be controlled by the controller 218 to have the electrochemical energy storage apparatus 22 output a current or voltage, or both, to be equal to the target output current or voltage.

Figure 13:
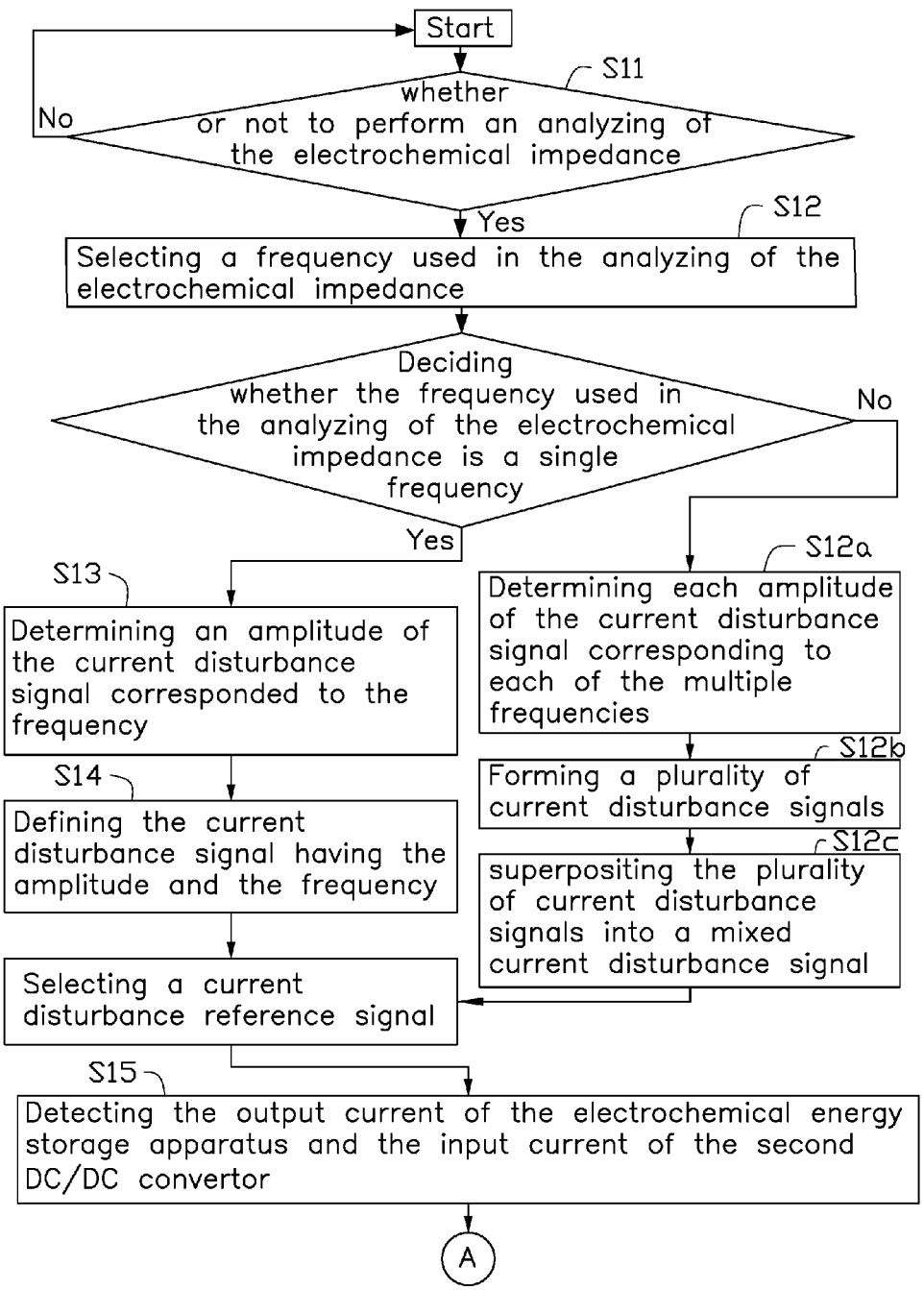
FIG. 13 is a flow chart of an embodiment of a method for generating a disturbance signal to be applied to an electrical current.
Figure 14:
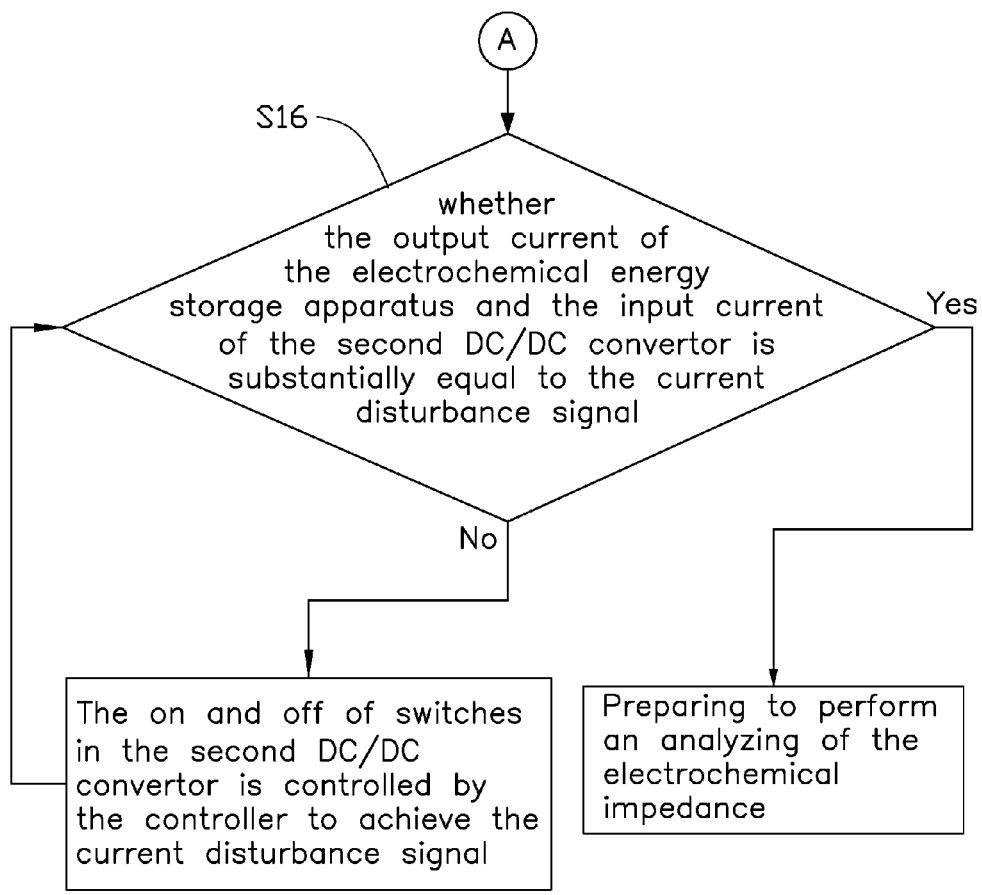
FIG. 14 is a flow chart of a continuation of FIG. 13.

Referring to FIG. 13 and FIG. 14, the step shown in block S1 can further comprise steps shown in blocks S11 to S16.

At block S11, a determination is made as to whether an analyzing of the electrochemical impedance is required, wherein if the answer is yes, the second DC/DC converter 204 is electrically conducted, and meanwhile the step in block S12 is performed; and if the answer is no, the second DC/DC converter 204 is cut off (i.e., short) from the circuit. At this situation, the second DC/DC converter 204 is not electrified.

At block S12, a frequency of the current disturbance signal used in the analyzing of the electrochemical impedance is selected.

At block S13, an amplitude of the current disturbance signal to correspond to the required frequency is determined.

At block S14, the current disturbance signal is defined according to the amplitude and the frequency.

At block S15, the output current of the electrochemical energy storage apparatus 22 and the input current of the second DC/DC converter 204 are detected.

At block S16, a determination is made whether the input current of the second DC/DC converter 204 is substantially equal to the current disturbance signal, wherein if the answer is no, then the controller 218 adjusts the switches in the second DC/DC converter 204 to achieve the input current of the second DC/DC converter 204 being substantially equal to the current disturbance signal. The time periods of on and off of the switches in the second DC/DC converter 204 are adjusted. For the second DC/DC converter 204s shown in FIG. 8 and FIG. 9, the "on" time of the switches is extended to increase the input current of the second DC/DC converter 204, and vice versa.

The process of block S12 can further comprise determining whether the frequency used in the analyzing of the electrochemical impedance is a single frequency, wherein if the frequency is a single frequency, then steps in blocks S13 to S16 are performed; and if there are multiple frequencies, then steps in blocks S12a to S12d are performed: in S12a each amplitude of the current disturbance signal is determined corresponding to each of the multiple frequencies;

in S12b, a plurality of current disturbance signals are formed;

in S12c, the plurality of current disturbance signals are superposed into a mixed current disturbance signal; and in S12d, steps S15 to S16 are performed.

At step S15, the purpose for detecting the output current of the electrochemical energy storage apparatus 22 is to determine whether or not the amplitude of the disturbed output current of the electrochemical energy storage apparatus 22 is the same as the amplitude of the current disturbance signal. If not the same, the current disturbance signal can be further adjusted to render the amplitude of the disturbed output current of the electrochemical energy storage apparatus 22 the same as that of the current disturbance signal.

At block S16, a confirmation can be further made, based on the disturbed output current of the electrochemical energy storage apparatus 22, that the current disturbance signal does not cause a shortfall in the level of power required by the electrical load.

At block S1, the current disturbance signal can be a sine wave having a relatively small amplitude, which both avoids a shortfall in power to the electrical load and forms a linear relationship with the response of the integrated DC/DC converter 200, to facilitate the mathematical processing of the detected data.

The value of the amplitude of the current disturbance signal can be 1% to 10% of the output current of the electrochemical energy storage apparatus 22. In one embodiment, the value of the amplitude of the current disturbance signal is 5% of the output current of the electrochemical energy storage apparatus 22.

At block S2, the disturbance is carried out by applying the current disturbance signal to the output current of the electrochemical energy storage apparatus 22. The electrochemical energy storage apparatus 22 can generate a signal in response (i.e., the disturbed output voltage) having the same frequency as the current disturbance signal. The electrochemical impedance at the selected frequency can be calculated by using the signal in response generated by the electrochemical energy storage apparatus 22 and the current disturbance signal.

Figure 15:
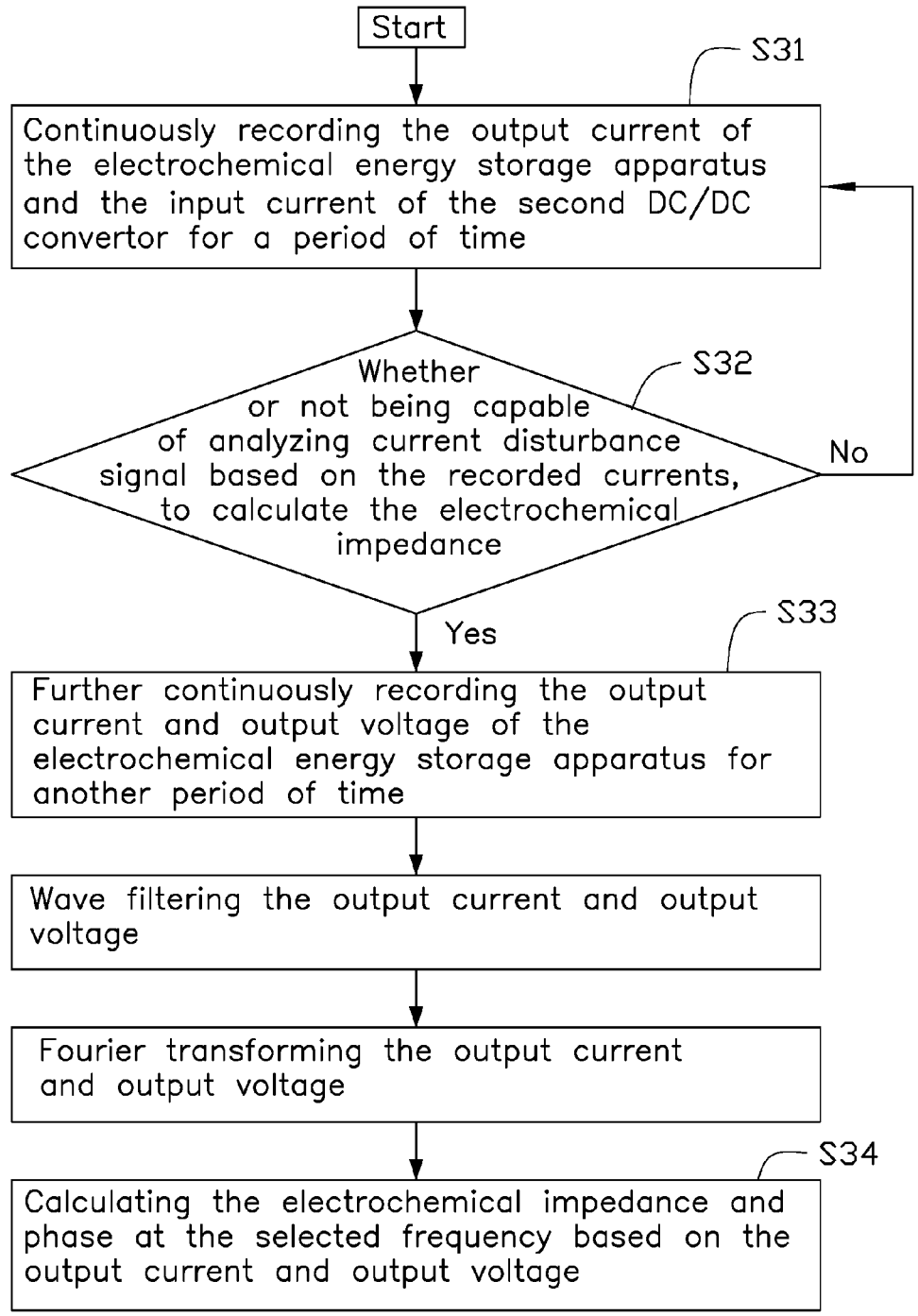
FIG. 15 is a flow chart of an embodiment of a method of electrochemical impedance analysis.

Referring to FIG. 15, to precisely calculate the electrochemical impedance at the selected frequency, the process of blocks S3 can further comprise processes in blocks S31 to S34.

At block S31, the output current of the electrochemical energy storage apparatus 22 and the input current of the second DC/DC converter 204 are continuously recorded for a period of time. There is a response time period between the moment of applying the current disturbance signal to the output current of the electrochemical energy storage apparatus 22 and the generation of the signal in response. Therefore, the output current of the electrochemical energy storage apparatus 22 and the input current of the second DC/DC converter 204 are previously recorded for a period of time as a history, to determine if they are disturbed by the instant disturbance current signal. The period of time at block S31 is related to the selected frequency. At a relatively high frequency, the period of time can comprise relatively greater number of sine wave periods (such as 10 periods). At a relatively low frequency, the period of time can comprise fewer sine wave periods (such as 2 periods or less). In one embodiment, the period of time can comprise one to ten periods of the sine wave. At block S31, the output current of the first DC/DC converter 202 can be further monitored to ensure a continuation of sufficient power to the electrical load.

At block S32, based on the recorded currents, a determination is made as to whether an analysis of the current disturbance signal can be made, to calculate the electrochemical impedance, wherein if the answer is no or not, then block S31 process is applied again; and if the answer is yes, then the process in block S33 is applied.

At block S32, a determination is made that a signal in response (i.e., the disturbed output current/voltage) is received, thus enabling an analysis of electrochemical impedance to be carried out.

At block S33, the output current and output voltage of the electrochemical energy storage apparatus 22 are continuously recorded for further period of time, which satisfies the electrochemical impedance analysis and ends as early as possible to decrease power consumption. In one embodiment, the period of time at block S33 can be smaller than 0.2 seconds. A wave filtering and a Fourier transforming can be further applied to the recorded output current and output voltage at block S33.

The disturbed output current i formed by applying the current disturbance signal to the output current of the electrochemical energy storage apparatus 22 can be calculated by equation (3).

$$i = I_1 + \Delta I \times \sin(2\pi f \times t + \phi_1) \qquad (3)$$

wherein, $I_1$ is the standard output current of the electrochemical energy storage apparatus 22 when the current disturbance signal is not applied, $\Delta I$ is the amplitude of the current disturbance signal, f is the selected frequency of the current disturbance signal, t is the period of time, and $\phi_1$ is the original phase of the current disturbance signal.

The disturbed output voltage u, responding to the current disturbance, can be calculated by equation (4).

$$u = U_1 + \Delta U \times \sin(2\pi f \times t + \phi_1 + \phi) \qquad (4)$$

wherein, $U_1$ is the standard output voltage of the electrochemical energy storage apparatus 22 when the current disturbance signal is not applied, $\Delta U$ is the amplitude of the voltage response disturbance signal corresponding to the current disturbance signal, and f is the frequency of the response signal, which is equal to the selected frequency of the current disturbance signal. t is the period of time, $\phi_1$ is the original phase of the current disturbance signal, and the value $\phi$ is the lacking phase of the response signal compared to the current disturbance signal.

At block S34, the electrochemical impedance and phase at the selected frequency are calculated based on the output current and output voltage.

The electrochemical impedance of the electrochemical energy storage apparatus 22 at the selected frequency f can be calculated by this equation (5).

$$Z(f) = \frac{\Delta U}{\Delta I} \times \cos\phi + j \frac{\Delta U}{\Delta I} \sin\phi \qquad (5)$$

wherein $$\frac{\Delta U}{\Delta I}$$

is the amplitude of the electrochemical impedance at the selected frequency f, and j is an imaginary unit.

By varying the frequency, the electrochemical impedance of the electrochemical energy storage apparatus 22 at different frequencies can be calculated. Thereby, an electrochemical impedance spectroscopy of the electrochemical energy storage apparatus 22 can be achieved. When the electrochemical energy storage apparatus 22 comprises a plurality of electrochemical energy storage cells, the output voltage and output current of each of the electrochemical energy storage cells can be detected, and the electrochemical impedance spectroscopy of each of the electrochemical energy storage cells can be achieved by the above method.

FIG. 15 presents a flowchart in accordance with an illustrated example embodiment. The embodiment of a method 400 for analyzing the working state of the electrochemical energy storage apparatus 22 is provided by way of example, as there are a variety of ways to carry out the method 400. Each block shown in FIG. 15 represents one or more processes, methods, or subroutines carried out in the exemplary method 400. Additionally, the illustrated order of blocks is by example only and the order of the blocks can be changed. The exemplary method 400 can begin at block T1. Depending on the embodiment, additional steps can be added, others removed, and the ordering of the steps can be changed.

At block T1, a typical electrochemical impedance spectroscopy is provided. The typical electrochemical impedance spectroscopy comprises a plurality of typical frequencies and corresponding impedances, which are capable of reflecting the working state of a specific element of an ideal electrochemical energy storage apparatus. The typical frequencies and corresponding impedances for reflecting the working state of each element in the ideal electrochemical energy storage apparatus can be provided.

At block T2, an actual electrochemical impedance spectroscopy of the target electrochemical energy storage apparatus 22 is obtained by the above mentioned method 300. The type of the target electrochemical energy storage apparatus 22 in the actual spectroscopy is the same type as the ideal electrochemical energy storage apparatus.

At block T3, the actual electrochemical impedance spectroscopy is compared with the typical electrochemical impedance spectroscopy to analyze the working states of specific elements of the target electrochemical energy storage apparatus 22.

At block T1, the typical electrochemical impedance spectroscopy can be obtained by achieving a number of electrochemical impedances corresponding to the number of typical frequencies of the ideal electrochemical energy storage apparatus which is in a relatively good working state and in a relatively ideal working environment. The typical electrochemical impedance spectroscopy can be obtained by using the above method 300 for analyzing electrochemical impedance spectroscopy. In the typical electrochemical impedance spectroscopy, the typical frequencies and corresponding impedances can reflect a good working state of each element of the ideal electrochemical energy storage apparatus.

At block T3, by comparing the typical electrochemical impedance spectroscopy with the actual electrochemical impedance spectroscopy, the working state of each element of the target electrochemical energy storage apparatus 22 can be evaluated to determine whether any changes should be made to keep the target electrochemical energy storage apparatus 22 in a good working state.

In one embodiment, only one or more electrochemical impedances, be it or they the actual target or typical, at specific frequencies relating to the working state of each element of the electrochemical energy storage apparatus are achieved.

The integrated DC/DC converter of the present disclosure can freely adjust the output of the electrochemical energy storage apparatus, and can in real time monitor and adjust the working state of the electrochemical energy storage apparatus. By the second DC/DC converter applying current disturbance signals having different frequencies to the output end of the electrochemical energy storage apparatus, and detecting the disturbed output current and voltage of the electrochemical energy storage apparatus, an electrochemical impedance spectroscopy of the electrochemical energy storage apparatus can be obtained. The electrochemical impedance spectroscopy enables the working state of the electrochemical energy storage apparatus to be analyzed. According to the analysis, the working conditions/environment of the electrochemical energy storage apparatus can be adjusted to maintain the apparatus working in a good state. The integrated DC/DC converter has low cost, small size, and can be used in vehicle.

Example 1

Figure 16:
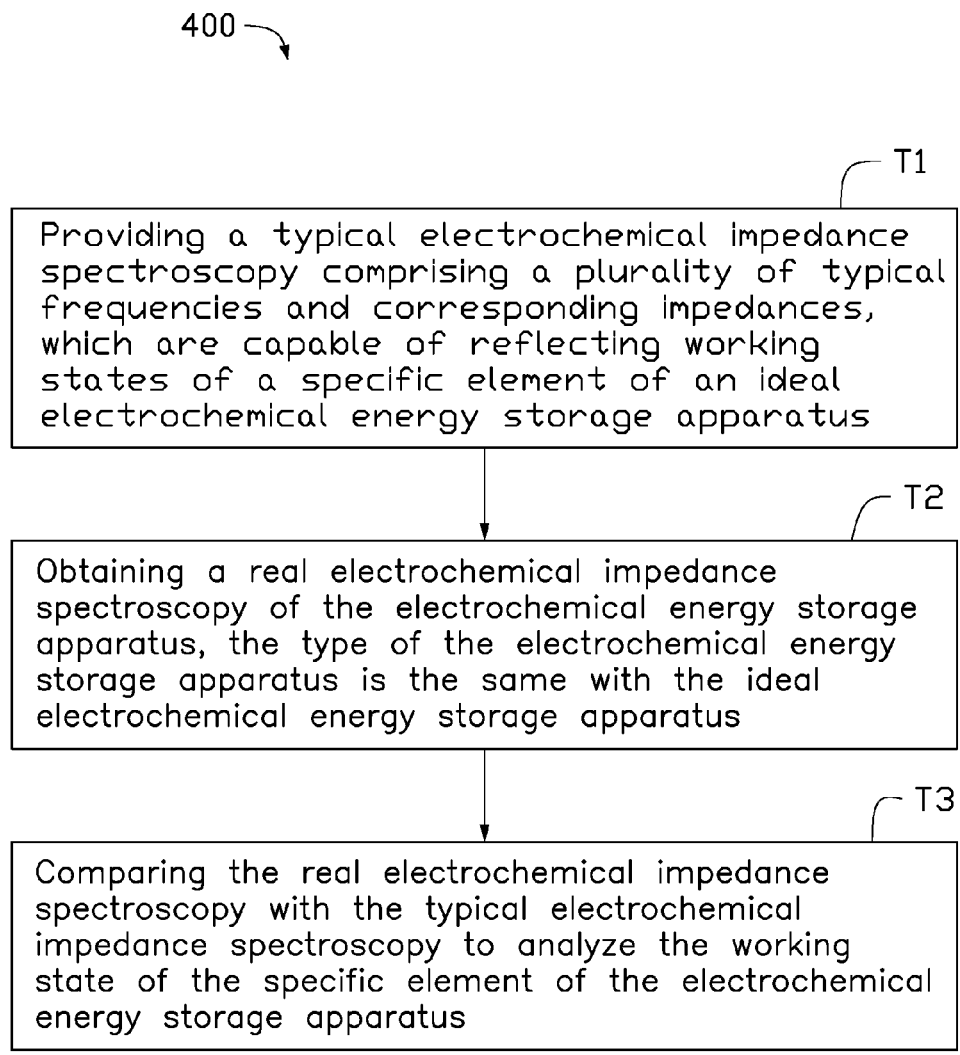
FIG. 16 is a flow chart of an embodiment of a method for analyzing working state of an electrochemical energy storage apparatus.
Figure 17:
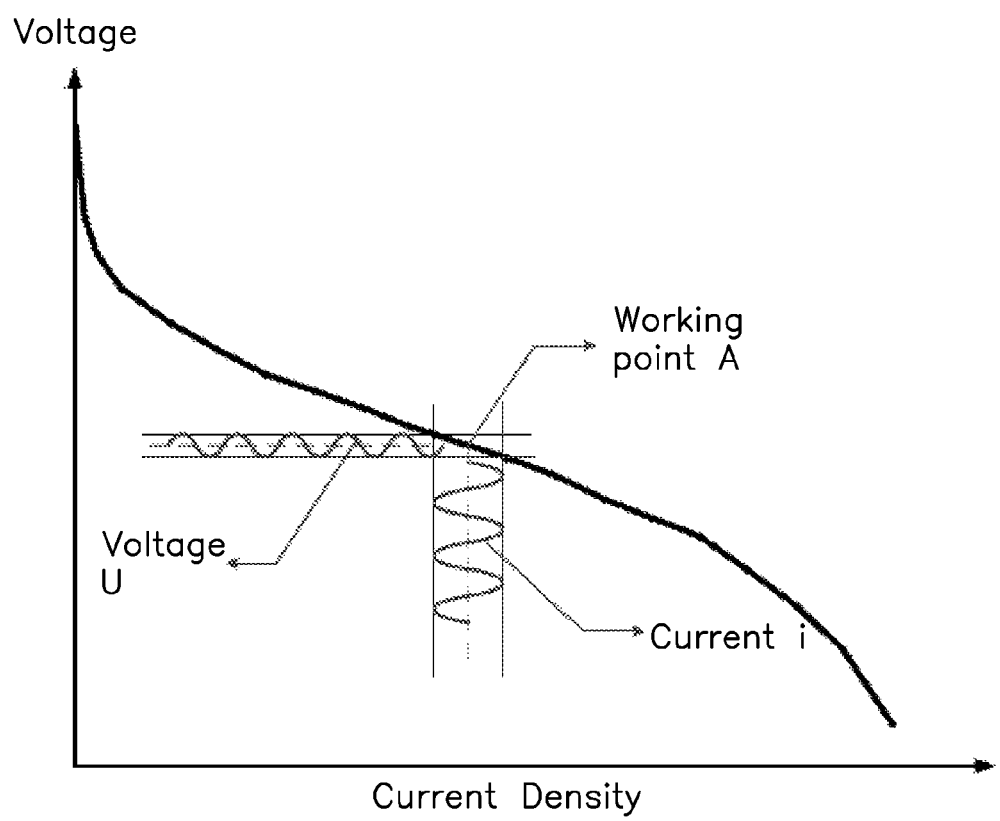
FIG. 17 is a diagram showing a polarization curve of a disturbed output current of the fuel cell stack described in Example 1.
Figure 18:
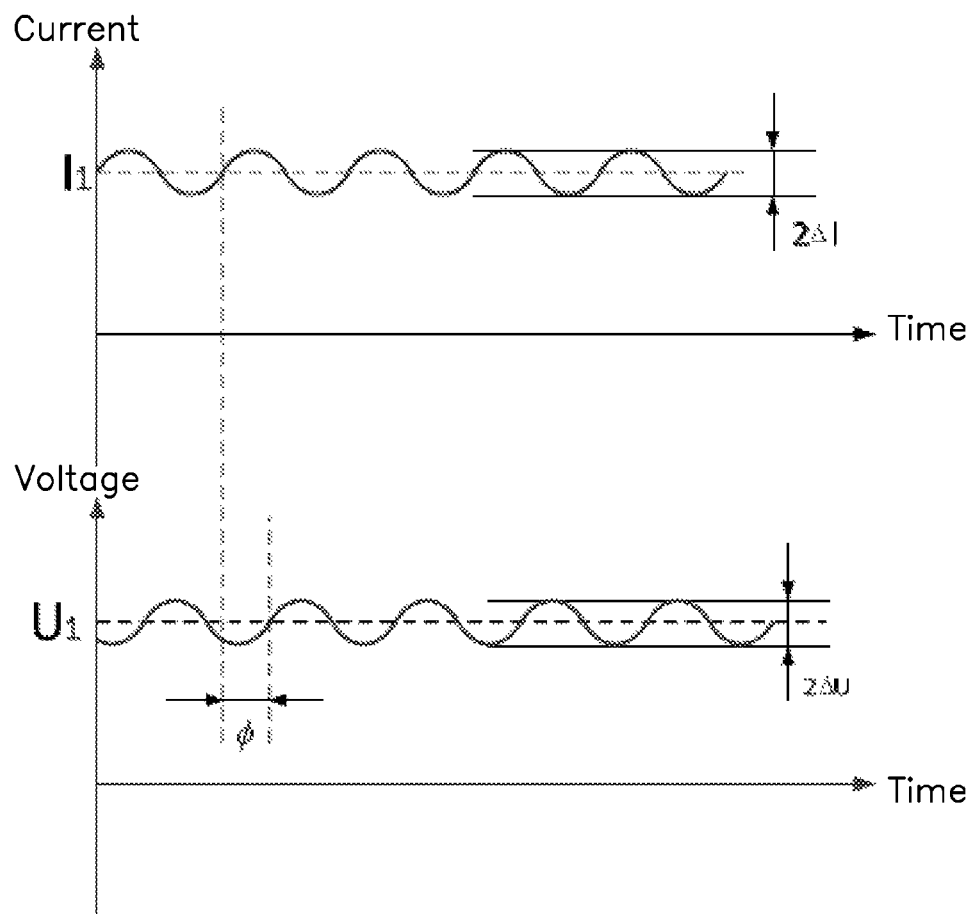
FIG. 18 is a diagram showing a disturbed output current signal and a response output voltage signal of the fuel cell stack described in Example 1.
Figure 19:
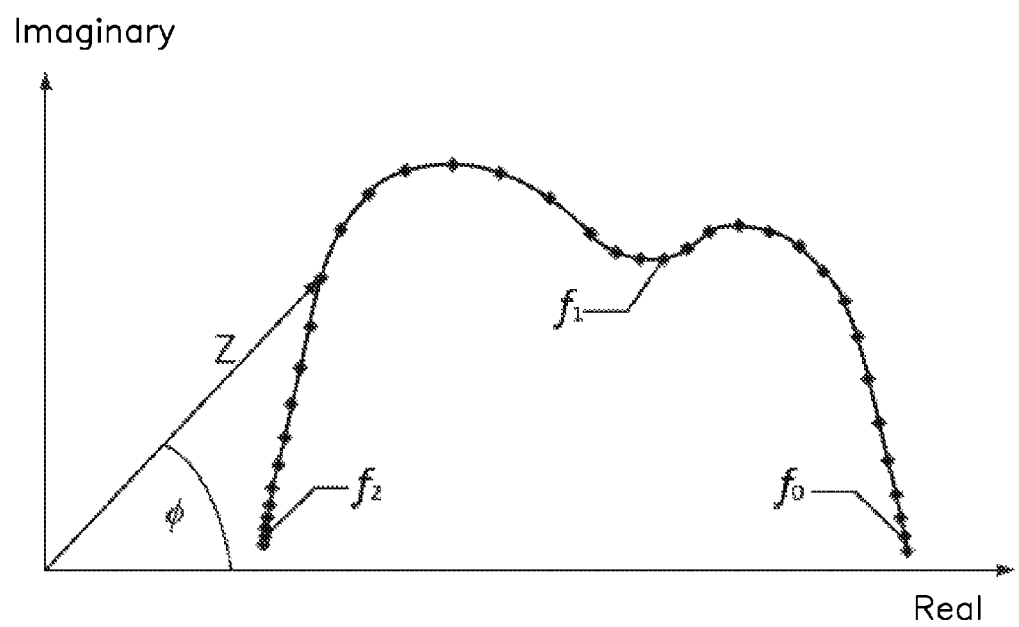
FIG. 19 is a diagram showing an electrochemical impedance spectroscopy of the fuel cell stack described in Example 1.

The electrochemical energy storage apparatus 22 in Example 1 is a fuel cell stack. Referring to FIG. 16 and FIG. 17, a current disturbance signal having a relatively small amplitude is used to disturb the output current of the fuel cell stack. The fuel cell stack can reveal a linear character at working point A when the amplitude of the current disturbance signal is relatively small. The electrochemical impedance of the fuel cell stack can be calculated by equation (5). Referring to FIG. 18, the specific frequencies and corresponding impedances reflect the working state of elements in the fuel cell stack.

Specifically, an impedance of the fuel cell stack at a relatively low frequency $f_0$ represents the impedance caused by substance transfers within the fuel cell stack, which reflects transferring speed of the reacting substances to reach the catalyst layer in the fuel cell. A typical frequency of the $f_0$ is 0.1 Hz. The impedance at the low frequency $f_0$ increases when the cathode/anode or the gas diffusion layer are blocked by liquid water, or when the reactant gases (e.g., H2 and O2) have a low pressure.

An impedance of the fuel cell stack at a medium frequency $f_1$ characterizes the dynamics of catalyst in the fuel cell. A typical frequency of the $f_0$ is 4 Hz. The impedance at the medium frequency $f_1$ increases when the catalyst is absent or rendered invalid (e.g., catalyst poisoning by CO gas).

An impedance of the fuel cell stack at a relatively high frequency $f_2$ represents the capacitive impedance in the fuel cell. A typical frequency of the $f_2$ is 1 kHz. The impedance at the high frequency $f_2$ increases when the assembly of the fuel cell is loose or the current collector is corroded. Meanwhile, the relatively high frequency $f_2$ also indicates the amount of water in the proton exchange membrane. The impedance at the high frequency $f_2$ increases when the proton exchange membrane of the fuel cell is saturated with water or dry.

Depending on the embodiment, certain of the steps of methods described may be removed, others may be added, and the sequence of steps may be altered. It is also to be understood that the description and the claims drawn to a method may comprise some indication in reference to certain steps. However, the indication used is only to be viewed for identification purposes and not as a suggestion as to an order for the steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An integrated DC/DC converter comprising:
   a first DC/DC converter comprising a first DC/DC converter input end that is electrically connected to an electrochemical energy storage apparatus, and a first DC/DC converter output end that is electrically connected to an electrical load input end;
   a second DC/DC converter connected to the first DC/DC converter in parallel;
   a first voltage sensor electrically connected in parallel with the first DC/DC converter input end, the first voltage sensor is capable of detecting an electrochemical energy storage apparatus output voltage;
   a second voltage sensor electrically connected in parallel to the first DC/DC converter output end, the second voltage sensor is capable of detecting a first DC/DC converter output voltage;
   a first current sensor connected in series to an electrochemical energy storage apparatus output end, the first current sensor is capable of detecting an electrochemical energy storage apparatus output current;
   a second current sensor connected in series to a second DC/DC converter input end, the second current sensor is capable of detecting a second DC/DC converter input current;
   a third current sensor connected in series to the first DC/DC converter output end, the third current sensor is capable of detecting a first DC/DC converter output current; and
   a controller receiving signals from the first voltage sensor, the second voltage sensor, the first current sensor, the second current sensor, the third current sensor, and the forth current sensor; the controller is capable of controlling the first DC/DC converter to adjust an output of the electrochemical energy storage apparatus and controlling on and off of the second DC/DC converter, and the controller is also capable of controlling the second DC/DC converter at an on state to adjust the electrochemical energy storage apparatus output current in a current disturbance way to obtain an electrochemical impedance spectroscopy of the electrochemical energy storage apparatus.

2. The integrated DC/DC converter of claim 1, wherein a power of the first DC/DC converter is greater than or equal to 20 kW, and a frequency of the second DC/DC converter is in a range from about 0.1 Hz to about 1 kHz.

3. The integrated DC/DC converter of claim 1 further comprising a voltage inspecting device that is capable of acquiring voltage of each of a plurality of electrochemical energy storage cells in the electrochemical energy storage apparatus, and sending the voltage to the controller.

4. The integrated DC/DC converter of claim 1, wherein the second DC/DC converter is a boost DC/DC converter comprising a first inductor (L1), a first diode (D1), a first switch (G1), and a first capacitor (C1); the first inductor (L1) connects one second DC/DC converter input end with an anode of the first diode (D1); a cathode of the first diode (D1) is one second DC/DC converter output end; the first switch (G1) has a base electrically connecting to the controller, a collector electrically connected to the anode of the first diode (D1), and an emitter being both another second DC/DC converter input end and another second DC/DC converter output end; the first capacitor (C1) has one end electrically connected to the cathode of the first diode (D1), and an opposite end electrically connected to the emitter of the first switch (G1).

5. The integrated DC/DC converter of claim 1, wherein the second DC/DC converter is a disturbance source comprising a second inductor (L1a), a second capacitor (C1a), a second switch (G1a), and a second diode (D1a), the second inductor (L1a) electrically connects a second DC/DC converter positive input end with an emitter of the second switch (G1a), the second capacitor (C1a) and the second DC/DC converter input end are electrically connected in parallel, a cathode of the second diode (D1a) is electrically connected to the emitter of the second switch (G1a), an anode of the second diode (D1a) is electrically connected to both one second DC/DC converter negative input end and one second DC/DC converter negative output end, a base of the second switch (G1a) is electrically connected to the controller, a collector of the second switch (G1a) electrically connected to one second DC/DC converter positive output end.

6. The integrated DC/DC converter of claim 1, wherein the second DC/DC converter is a disturbance source comprising a first and second resistors (R1b, R2b), a first transformer (T1b), a third switch (G1b), a fourth switch (G2b), a fifth switch (G3b), and a sixth switch (G4b); the first transformer (T1b) comprises a primary winding and a secondary winding, the primary winding electrically connected a second DC/DC converter positive input end with the first resistor (R1b); the primary winding, the first resistor (R1b), and one second DC/DC converter negative input end are connected in series connection; the secondary winding electrically connects the second resistor (R2b) with an emitter of the fourth switch (G2b); the secondary winding, the second resistor (R2b), and an emitter of the third switch (G1b) are connected in series connection; and the third switch (G1b), the fourth switch (G2b), the fifth switch (G3b) and the sixth switch (G4b) form a bridge circuit.

7. An electrochemical energy storage system comprising an electrochemical energy storage apparatus, a control system, and an integrated DC/DC converter, the control system is capable of maintaining a stable electric energy output of the electrochemical energy storage apparatus, the integrated DC/DC converter comprising:
   a first DC/DC converter having a first DC/DC converter input end and a first DC/DC converter output end, the first DC/DC converter input end is electrically connected to an electrochemical energy storage apparatus, the first DC/DC converter output end is electrically connected to an electrical load;
   a second DC/DC converter connecting the first DC/DC converter in parallel, the second DC/DC converter having a second DC/DC converter input end and a second DC/DC converter output end;
   a first voltage sensor electrically connected in parallel with the first DC/DC converter input end to detect an electrochemical energy storage apparatus output voltage;
   a second voltage sensor electrically connected in parallel to the first DC/DC converter output end, the second voltage sensor is capable of detecting a first DC/DC converter output voltage;
   a first current sensor connected to the electrochemical energy storage apparatus in series, the first current sensor is capable of detecting an output current of the electrochemical energy storage apparatus;

a second current sensor connected to the second DC/DC converter input end in series, the second current sensor is capable of detecting a second DC/DC converter input current;

a third current sensor connected to the first DC/DC converter output end in series, the third current sensor is capable of detecting a first DC/DC converter output current; and a controller receiving signals from the first voltage sensor, the second voltage sensor, the first current sensor, the second current sensor, and the third current sensor, the controller controlling the first DC/DC converter, the controller is capable of adjusting an output of the electrochemical energy storage apparatus and controlling on and off of the second DC/DC converter, and the controller is also capable of controlling the second DC/DC converter at an on state to adjust an electrochemical energy storage apparatus output current in a current disturbance way to obtain an electrochemical impedance spectroscopy of the electrochemical energy storage apparatus.

8. The electrochemical energy storage system of claim 7 further comprising a second electrochemical energy storage apparatus connected to the integrated DC/DC converter output end, and the electrical load is connected to the second electrochemical energy storage apparatus in parallel.

9. The electrochemical energy storage system of claim 8, wherein the electrical load is an electric motor.

10. The electrochemical energy storage system of claim 7, wherein the electrochemical energy storage apparatus comprises an electrochemical energy storage cell.

11. The electrochemical energy storage system of claim 10, wherein the electrochemical energy storage cell is at least one of a fuel cell, a lithium battery, and a supercapacitor.

12. A method for analyzing an electrochemical impedance spectroscopy of an electrochemical energy storage apparatus comprising:

S1, supplying an electric current to a second DC/DC converter to generate a current disturbance signal;

S2, disturbing an output current of the electrochemical energy storage apparatus by the current disturbance signal;

S3, detecting a disturbed output current and disturbed output voltage of the electrochemical energy storage apparatus;

S4, calculating an impedance corresponding to a frequency of the current disturbance signal based on the current disturbance signal, the disturbed output current, and the disturbed output voltage; and S5, varying the frequency of the current disturbance signal and disturbing again the output current of the electrochemical energy storage apparatus.

13. The method of claim 12, further comprising a step of generating the current disturbance signal comprising:

S11, deciding whether or not to perform an analyzing of electrochemical impedance, wherein
if an answer is yes, the second DC/DC converter is electrically conducted, and meanwhile step S12 is performed, and
if the answer is no, the second DC/DC converter is not electrically conducted;

S12, selecting a frequency used in the analyzing of the electrochemical impedance;

S13, determining a current disturbance signal amplitude corresponding to the frequency;

S14, defining the current disturbance signal having the current disturbance signal amplitude and the frequency;

S15, detecting the output current of the electrochemical energy storage apparatus and a second DC/DC converter input current; and S16, judging whether the second DC/DC converter input current is substantially equal to the current disturbance signal, wherein if the second DC/DC converter input current is not substantially equal to the current disturbance signal, then the on and off of switches in the second DC/DC converter is controlled by a controller to achieve the current disturbance signal.

14. The method of claim 13, wherein step S12 further comprises a step of deciding whether the frequency used in the analyzing of the electrochemical impedance is a single frequency, wherein
if the frequency is a single frequency, then the steps in blocks S13 to S16 are performed; and
if there are multiple frequencies, then steps S12a to S12d are performed:

S12a, determining each amplitude of the current disturbance signal corresponding to each of the multiple frequencies;

S12b, forming a plurality of current disturbance signals;

S12c, superpositioning the plurality of current disturbance signals into a mixed current disturbance signal; and S12d, performing steps in blocks S15 to S16.

15. The method of claim 12, wherein a value of the amplitude of the current disturbance signal is 1% to 10% of the output current of the electrochemical energy storage apparatus.

16. The method of claim 12, wherein step S3 comprises the following steps:

S31, continuously recording the output current of the electrochemical energy storage apparatus and the second DC/DC converter input current of the for a period of time;

S32, deciding whether or not being capable of analyzing current disturbance signal based on recorded currents, to calculate the electrochemical impedance, wherein if an answer is no, then performing again step S31, and if the answer is yes, then performing step S33;

S33, further continuously recording the output current and output voltage of the electrochemical energy storage apparatus for a further period of time; and S34, calculating the electrochemical impedance and phase at selected frequency based on the output current and output voltage.

17. The method of claim 16 further comprising wave filtering and Fourier transforming to the recorded output current and output voltage step S33 before step S34.

18. The method of claim 12, wherein the disturbed output current i satisfies equation (3), wherein equation (3) is $i=I_1+\Delta I \times \sin(2\pi f \times t + \phi_1)$,
wherein, $I_1$ is the output current of the electrochemical energy storage apparatus, $\Delta I$ is the amplitude of the current disturbance signal, f is the frequency of the current disturbance signal, t is a period of time, and $\phi_1$ is an original phase of the current disturbance signal;

disturbed output voltage u responded to the current disturbance signal satisfies equation (4), wherein equation (4) is $u=U_1+\Delta U \times \sin(2\pi f \times t + \phi_1 + \phi)$,
wherein $U_1$ is the output voltage of the electrochemical energy storage apparatus, $\Delta U$ is an amplitude of the voltage response disturbance signal to the current disturbance signal, f is the frequency of a response signal, which is equal to a selected frequency of the current disturbance signal, t is a period of time, $\phi_1$ is an original phase of the current disturbance signal, the $\phi$ is a lacking phase of the response signal comparing to the current disturbance signal; and the electrochemical impedance of the electrochemical energy storage apparatus at the selected frequency f is calculated by equation (5), wherein equation (5) is $$Z(f) = \frac{\Delta U}{\Delta I} \times \cos\phi + j\frac{\Delta U}{\Delta I}\sin\phi,$$

wherein $$\frac{\Delta U}{\Delta I}$$

is the amplitude of the electrochemical impedance at the frequency f, and j is imaginary unit.

19. The method of claim 12, wherein the electrochemical energy storage apparatus comprises a plurality of electrochemical energy storage cells, the output voltage and output current of each of the plurality of electrochemical energy storage cells are detected, and the electrochemical impedance spectroscopy of each of the electrochemical energy storage cells are achieved respectively.

* * * * *